United States Patent
Goering et al.

[11] Patent Number: 6,151,168
[45] Date of Patent: Nov. 21, 2000

[54] OPTICAL ARRAY FOR SYMMETRIZATION OF LASER DIODE BEAMS

[75] Inventors: Rolf Goering; Peter Schreiber; Torsten Possner, all of Jena, Germany

[73] Assignee: Fraunhofer-Gesellschaft zur Foerderung der Angewandten Forschung E.V., Germany

[21] Appl. No.: 09/297,050

[22] PCT Filed: Oct. 27, 1997

[86] PCT No.: PCT/DE97/02573

§ 371 Date: Jun. 21, 1999

§ 102(e) Date: Jun. 21, 1999

[87] PCT Pub. No.: WO98/19202

PCT Pub. Date: May 7, 1998

[30] Foreign Application Priority Data

Oct. 28, 1996 [DE] Germany ............... 196 45 150

[51] Int. Cl.[7] ............... G02B 27/10; G02B 3/00; G02B 13/18; H01S 3/091
[52] U.S. Cl. ............... 359/623; 359/626; 359/627; 359/652; 359/710; 372/75
[58] Field of Search ............... 359/652, 623, 359/626, 627, 710; 372/75

[56] References Cited

U.S. PATENT DOCUMENTS

| | | | |
|---|---|---|---|
| 5,050,153 | 9/1991 | Lee | 369/112 |
| 5,081,639 | 1/1992 | Snyder et al. | 372/101 |
| 5,168,401 | 12/1992 | Endriz | 359/625 |
| 5,181,224 | 1/1993 | Snyder | 372/101 |
| 5,243,619 | 9/1993 | Albers et al. | |
| 5,321,718 | 6/1994 | Waarts et al. | 372/108 |
| 5,513,201 | 4/1996 | Yamaguchi et al. | |
| 5,557,475 | 9/1996 | Nightingale et al. | |
| 5,636,069 | 6/1997 | Nightingale et al. | |
| 5,790,576 | 8/1998 | Waarts et al. | 372/43 |
| 5,867,324 | 9/1991 | Kmetec et al. | 359/625 |

FOREIGN PATENT DOCUMENTS

| | | |
|---|---|---|
| 0 484 276 | 5/1992 | European Pat. Off. . |
| 44 38 368 | 5/1996 | Germany . |
| WO 96/02013 | 1/1996 | WIPO . |

OTHER PUBLICATIONS

Patent Abstracts of Japan; vol. 096, No. 002, Feb. 29, 1996, JP 07 287105A; Nippon Steel Corp., published Oct. 31, 1995; Saito Yoshimasa.

Patent Abstracts of Japan; vol. 010, No. 358 (p. 522); Dec. 2, 1986; JP 61 156219A; Fuji Photo Film Co., Ltd., published Jul. 15, 1986; Ishikawa Hiromi.

Rolf Goring, Peter Schreiber, and Torsten Possner; "Microoptical beam transformation system for high-power laser diode bars with efficient brightness conservation"; The International Society for Optical Engineering, Miniaturized System with Microoptics and Micromechanics II, Feb. 10–12, 1997, SPIE vol. 3008, San Jose, pp. 202–210, XP002057348.

*Primary Examiner*—Georgia Epps
*Assistant Examiner*—Evelyn A. Lester
*Attorney, Agent, or Firm*—Marshall & Melhorn

[57] ABSTRACT

The invention relates to an optical array for symmetrization of the beam of multiple sequentially fixed adjacent laser diodes, their respective output radiation being asymmetrical in relation to a first and a second direction that are perpendicular to each other. A cylindrical lens with sufficient isoplanacy is mounted on the tilted optical axis (z axis), which is perpendicular to the plane predetermined by the two directions (x, y). The lens collimates and displaces the output beam bundle of the individual laser diodes in the first direction (x). The cylindrical lens is mounted downstream a directional element that deflects the beam bundle of the individual laser diodes in the second direction (y) with different deflecting angles respectively in such a way that the centers of gravity of the individual beam bundles converge at a predetermined spacing. A redirection element is mounted in the spacing behind the directional element which compensates the different deflection angles of the beam bundle to the optical axis (z axis).

20 Claims, 2 Drawing Sheets

OPTICAL ARRAY FOR SYMMETRIZATION OF LASER DIODE BEAMS

BACKGROUND OF THE INVENTION

1. Field of the Invention

The invention concerns an optical assembly for symmetrizing the radiation of laser diodes and more particularly for symmetrizing the radiation of a plurality of laser diodes arranged adjacent to each other in the y-direction in fixed coordination, which radiate in the z-direction and whose radiation in the x-z and y-z planes is asymmetrical, a cylindrical lens system being mounted behind the laser diodes.

2. Description of the Prior Art

To produce high-power laser diode assemblies, a plurality of laser diodes are arranged adjacent to each other in fixed coordination in so-called laser diode bars. Laser diode bars of this kind with optical output power in the region of up to about 30 W usually consist of several laser diodes arranged in a row as individual emitters with geometrical dimensions of the radiating surface between about 50×1 mm and about 200×1 mm, the linear arrangement of these emitters always being in the direction of their maximum extent. The output radiation of these laser diode bars is extremely asymmetrical. For most practical applications of such laser diode bars, for example for pumping solid-state lasers, for purposes of material processing and medical purposes, a symmetrical beam of high radiance is needed. For wide use of high-power diode lasers in these fields, optical systems as compact as possible are therefore necessary for beam symmetrization.

Assemblies for symmetrizing the radiation of high-power laser diodes using for example special beam rotating elements in the form of prisms are known, whereby the beams emitted by the individual emitters are spatially typically turned through 90° (U.S. Pat. No. 5,168,401, EP 0 484 276). In another arrangement the output radiation of the laser diodes passes through a system of two highly reflective surfaces slightly inclined to each other, in such a way that suitable reconfiguring of the laser diode beam occurs at the output of this system (WO 95/15510). In all cases a largely symmetrical output beam which can easily be focussed is provided.

Disadvantages of these known systems are in particular the complicated nature of the microoptical elements used, this applying in particular to the beam rotation in which realization appears extremely difficult for larger numbers of emitters in the laser diode bar, the high expenditure on adjustment of the whole system and the lack of possibilities of cheap production of such systems.

SUMMARY OF THE INVENTION

Starting from the state of the art, it is the object of the invention to provide an optical assembly for symmetrizing the radiation of a plurality of laser diodes arranged adjacent to each other in fixed coordination, which, using comparatively simple microoptical components, transforms the output radiation without loss of radiance and with improved optical efficiency and at the same time reduction of the dimensions of the assembly. This object is achieved according to the invention by the characterizing features of the main claim in combination with the features of the introductory part.

Due to the fact that a microcylindrical lens with sufficient isoplanasia is arranged in inclined orientation to the laser diode bar, that is, tilted about the optical axis referred to as the z-axis, the output beams of the individual emitters acquire different radiation angles and are thus separated at a long enough distance behind the lens in the desired direction perpendicularly to the direction of the linear assembly of individual emitters. Due to a subsequent optical deflection element which is referred to as the direction element hereafter, the output radiation of the individual laser diodes or emitters is deflected in the direction of the linear assembly of individual laser diodes in such a way that at a predetermined distance behind the direction element the centroids of the beams coincide in this direction. Owing to the fact that furthermore behind the direction element is arranged a second deflection element, referred to hereafter as the redirection element, which deflects the output beams of the individual laser diodes in such a way that the angles of deflection produced by the direction element are recompensated, a simple, cheap assembly for beam formation is provided in general, which has improved optical efficiency compared with the state of the art.

No beam-rotating elements are necessary; symmetrization of radiation is achieved by multiple deflection. Segmentation of the optical image is caused by the lateral distances between the individual emitters and the redirection element adjusted thereto; the distances can be kept short so that a high density of occupation of the laser diode bar is made possible.

Due to the measures indicated in the subsidiary claims, advantageous developments and improvements are possible.

BRIEF DESCRIPTION OF THE DRAWINGS

A practical example is shown in the drawings and described in more detail in the description below. They show.

DESCRIPTION OF THE PREFERRED EMBODIMENTS

Figure 1:
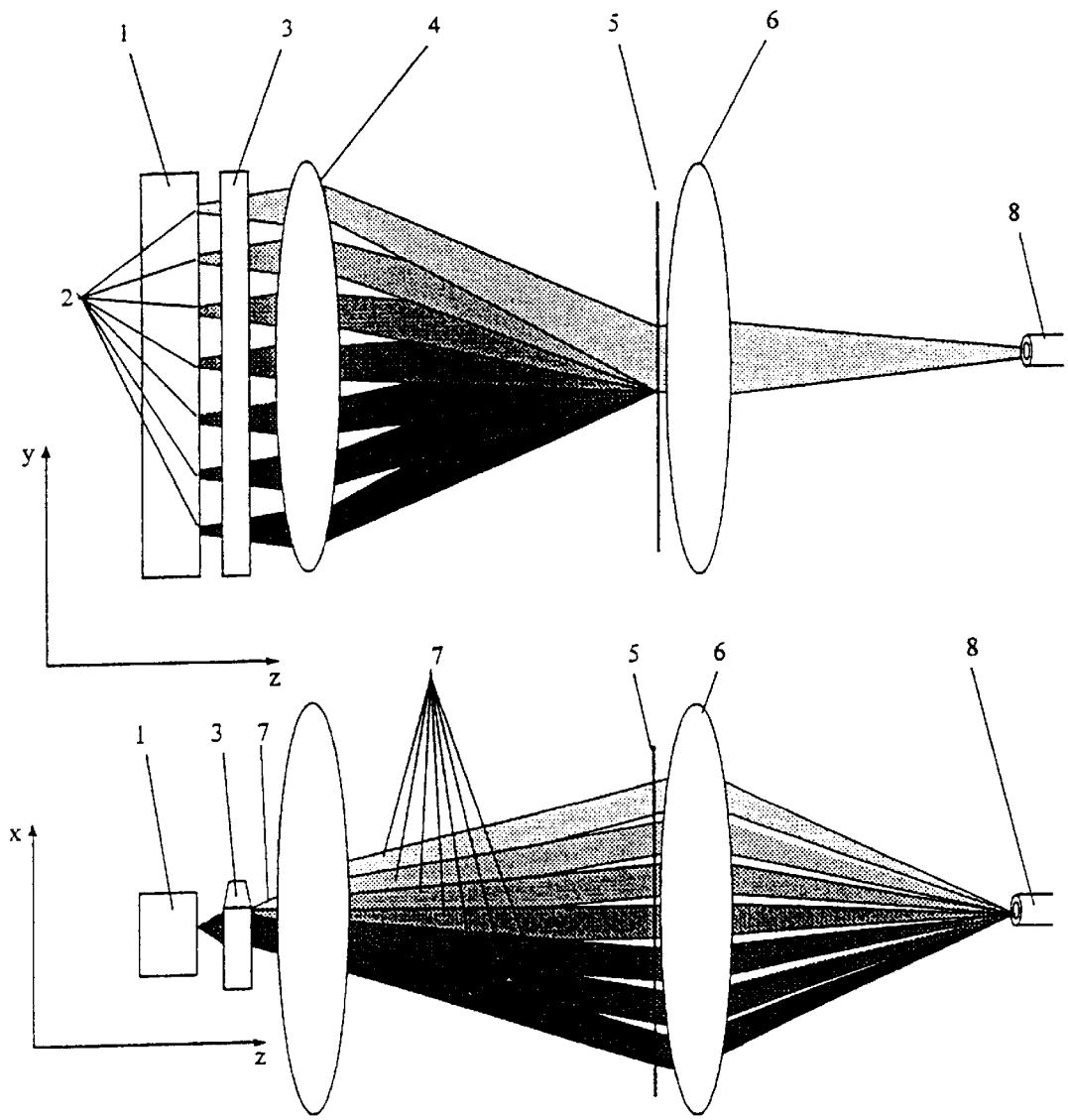
FIG. 1 the optical assembly for symmetrizing the radiation of a plurality of laser diodes in two different planes with the beam paths, FIG. 2 the optical beam paths in the two planes for a laser diode arranged in the middle of the laser diode bar, and FIG. 3 the beam paths of a laser diode arranged at the edge of the laser diode bar.

In the optical assembly for beam formation shown in FIG. 1, a high-power laser diode bar is marked 1. The laser diode bar 1 comprises a plurality of individual laser diodes or individual emitters 2 which are arranged adjacent to each other in the y-direction and have a fixed distance from each other. A typical laser diode bar 1 has a dimension of 10 mm in the direction of arrangement adjacent to each other (y-direction), the individual emitters, for example 16, being arranged in a line. The dimension of the emitters in the y-direction varies between about 50 mm and 200 mm and depends on the specific type of laser diode. The divergence of the output radiation of each individual laser diode is relatively small in the y-z plane shown at the top in FIG. 1, and the half beam angle is about 6°. In the direction perpendicular to the y-direction (x-direction), the dimensions of the individual laser diodes are about 1 mm, the size being predetermined by epitaxy. Accordingly the divergence of the output radiation in the x-z plane shown at the bottom in FIG. 1 is much greater and the half beam angle is about 30°. Between the individual laser diodes or emitters are located regions in which no radiation is emitted.

The extreme asymmetry of the output radiation occurring on account of the different dimensions in the x and y-directions is unfavorable for many applications. Symmetrization of the output radiation requires rearrangement of the beams of the individual laser diodes in such a way that they are arranged linearly in the originally highly divergent direction (x-direction).

Parallel to the laser diode bar 1 is arranged a collimator microcylindrical lens 3 which, as shown at the bottom in FIG. 1, is tilted about the z-axis, which constitutes the optical axis. The microcylindrical lens 3 is designed so as to exhibit sufficient isoplanasia. The respective output beams 7 of the individual laser diodes 2 are each collimated independently, acquire different radiation angles relative to the original optical axis (z-axis in FIG. 1) due to the tilt of the microcylindrical lens 3 and are thus, as seen in the x-direction, shifted in height or separated. The radiation in the y-z direction of the individual laser diodes 2 passes unchanged through the cylindrical lens. A graded-index microcylindrical lens with a one-dimensional or two-dimensional refractive index profile can be used as the collimator microcylindrical lens. Aspherical microcylindrical lenses can be used too, which however leads to impairment of collimation in case of an extraaxial arrangement. Furthermore the use of a Fresnel cylindrical lens, a plano-convex or biconvex lens including fiber lens (round cross-section) and a multicomponent cylindrical lens system consisting of two or more of the individual lenses described above, is conceivable.

Behind the microcylindrical lens 3 is arranged an optical direction element 4 which for example can be constructed as an achromatic lens. Instead of the achromatic lens, other lenses can be used, for example a biconvex or plano-convex lens with spherical or aspherical surfaces or a biconvex or plano-convex cylindrical lens. As can be seen from the top of FIG. 1, the output beams 7 of the individual laser diodes 2 are deflected in the direction of the linear assembly of individual laser diodes 2 in the bar 1, that is, in the y-z plane, in such a way that at a given distance behind the direction element 4 the centroids of the beams coincide, i.e. in the y-direction at the predetermined distance the beams are located one on top of the other. In the x-z plane the beams are only slightly influenced.

At the predetermined distance at which according to the top of FIG. 1 the centroids of the individual beams coincide, is arranged an optical redirection element 5 which deflects the beams of the individual laser diodes in such a way that the different angles of incidence produced by the direction element 4 in the y-z plane are corrected, i.e. the angles of inclination to the z-axis or optical axis produced by the direction element are recompensated. The redirection element 5 must have different deflection regions arranged linearly for obtaining the different angles of deflection, and can for example consist of narrow prismatic bodies. It is however very complicated to produce such a redirection element 5. A simpler embodiment consists of a grid array with deflection grids. The redirection element 5 can also be constructed as a mirror array.

After the redirection element 5 the beams of the individual laser diodes 2 run in the same direction in relation to the y-z plane, that is, the radiation of the individual laser diodes 2 according to the top of FIG. 1 is located one on top of the other behind the redirection element. In the x-z plane according to the bottom of FIG. 1 the individual beams 7 continue to retain their divergent directions relative to each other.

Behind the redirection element 5 is a focusing lens system 6 which can for example consist of achromatic lenses, and the beams 7 of the individual laser diodes 2 can now both in the y-z plane and in the x-z plane be very easily focused in a largely symmetrical beam spot of small dimensions, as can be seen from FIG. 1. This radiation can then be coupled with high efficiency to an optical fiber in the embodiment shown.

Figure 3:
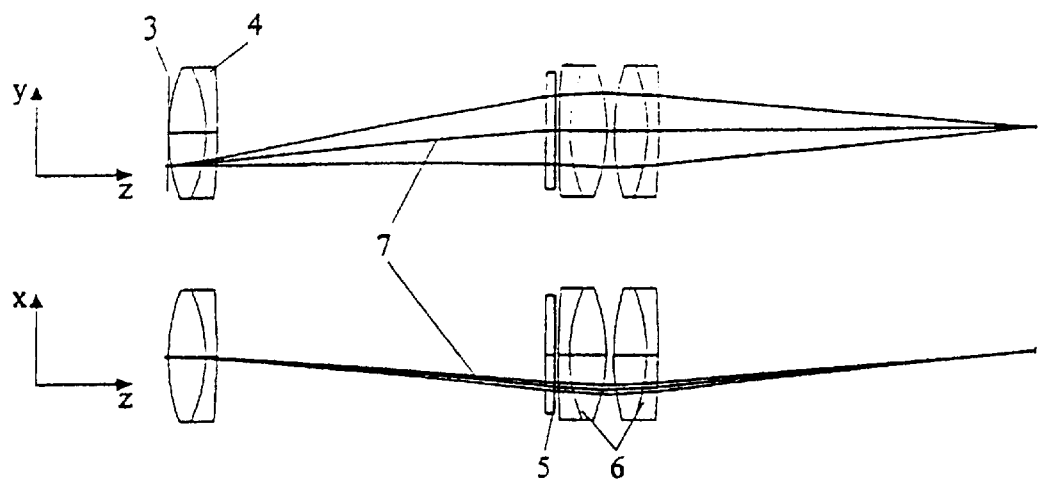
Figure 2:
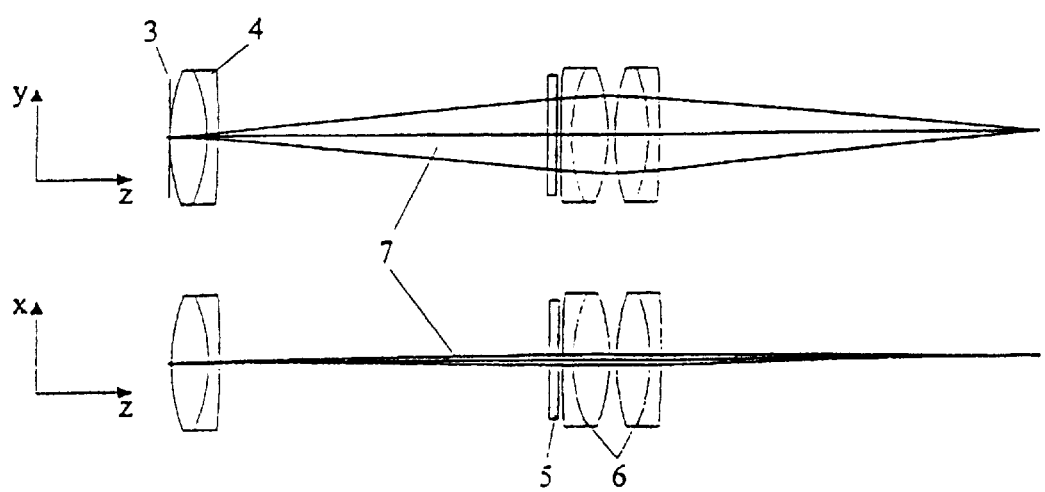

In FIG. 2 and FIG. 3 are shown optical beam paths which have been calculated for the following embodiment. A graded-index (GRIN) microcylindrical lens 3 which in this embodiment has a dimension in the x-direction of 300 mm is used for collimation of the highly divergent radiation direction (x-direction) and deflection of the collimated individual beams 7 likewise in the x-direction. By tilting the graded-index microcylindrical lens 3 in relation to the laser diode bar 1 by rotation about the z-axis through about 1°, the individual laser diodes 2 are shifted to different degrees in relation to the optical axis of the microcylindrical lens 3, this being in such a way that the central emitters or the central laser diodes are hardly collimated at all, and the edge emitters, i.e. the laser diodes 2 located at the edge of the laser diode bar 1, are collimated extraaxially the most. This leads to deflection of the collimated beams relative to the z-axis after the microcylindrical lens 3. As can be seen from FIGS. 2 and 3 in each case in the bottom view, the extraaxial arrangement with the microcylindrical lens 3 used does not lead to impairment of collimation, which is possible with aspherical microcylindrical lenses. In the embodiment shown, furthermore a commercially available achromatic lens with a focal length in the region of 50 mm is used for the direction element 4. FIGS. 2 and 3 show the different deflections by the achromatic lens 4 for a center emitter and an edge emitter, the radiation for the center emitter being shown in FIG. 2 and the radiation for the edge emitter in FIG. 3. The additional lens effect (divergence reduction) of the achromatic lens 4 is only of secondary effect.

The following conditions arise in the plane of the redirection element 5 in the specific embodiment:

In the y-z plane (top views in FIGS. 2 and 3) all the beams 7 of the individual emitters or individual laser diodes 2 are located centrally. The angles of incidence in relation to the z-axis are here between 0° for the center emitter and ± approximately 6° for the two edge emitters according to the width of the laser diode bar 1 of 10 mm, i.e. the edge emitters are located 5 mm off axis. Naturally the central location of the individual beams 7 occurs when the plane of redirection is at the distance of the focal length behind the achromatic lens 4. With the typical divergence of output radiation of the laser diodes 2 in the y-z plane of approximately 6° indicated above (half beam angle), the result is a beam width in the y-direction in the plane of redirection of about 10 mm.

In the x-z plane (bottom views in FIGS. 2 and 3), on the redirection element 5 for the above dimensions and distances is a width of the beams of the individual emitters or laser diodes 2 of approximately 0.5 to 0.6 mm, depending on the actual emitter divergence in this plane. In order to be able to separate and deflect separately the associated individual beams, for example for a laser diode bar 1 with 16 emitters, a distance of 0.6 mm between the centroids of the beams in the x-direction is necessary. This means that the two beams of the edge emitters must be deflected in the x-direction by about ±6° (see FIG. 3). This requires the above-mentioned tilt of the microcylindrical lens 3 by approximately 1°. The total extent of the output radiation of the laser diodes in the x-direction is then about 10 mm (16 emitters×0.6 mm).

As a result, in the plane of redirection there is produced an almost symmetrical total beam with a beam cross-section of 10 mm×10 mm, consisting of a row of individual beams arranged one on top of the other in the x-direction, which in turn are to be assigned to the individual emitters 2 of the laser diode bar 1 arranged in the y-direction, i.e. the total radiation in the x-y plane consists of 16 beams one on top of the other with dimensions of 0.6 mm in the x-direction and 10 mm in the y-direction. Thus the symmetrization necessary for the efficient focusing provided subsequently is achieved.

The redirection element 5 must however still correct the different angles of incidence of the beams of the individual laser diodes 2 in the y-z plane, which angles are shown at the top of FIG. 1. Due to the spatial separation of the individual beams which is present in the x-direction according to the bottom of FIG. 1, correction can be carried out basically in the plane of redirection, different deflection being necessary for each individual beam. In the embodiment shown in FIGS. 2 and 3 these angles of deflection are between 0° for the beam of the center emitter and 6° for the beams of the edge emitters. According to the dimensions of the beams in the plane of redirection, the individual deflection regions must here have a width of 0.6 mm in the x-direction and at least 10 mm in the y-direction. In the embodiment, instead of the conventional design with 16 narrow prismatic bodies, a grid array of 16 differently deflecting narrow regions using the possibilities of microstructuring is used; it is technically relatively simple to produce the grid array with the required maximum angles of deflection of only 6° grid periods.

For final focusing of the whole beam in a spot as small as possible, two commercial achromatic lenses with focal lengths of 50 mm and 60 mm are used in the embodiment. With this focusing lens system 6, beam widths at the focus of about 0.2×0.2 mm are produced, this being with a convergence of the beam of about 6° half beam angle. With greater focusing the beam at the focus is correspondingly smaller.

The focusing lens system 6 can also be formed from two lenses between which is arranged the redirection element 5.

To improve the imaging properties of the optical assembly, an array of cylindrical lenses working in the x-z plane can be mounted in front of or behind the redirection element 5 in such a way that each region of the redirection element 5 is assigned a cylindrical lens whose width in the x or y-direction corresponds to the width of the deflection regions of the deflection grid array or of the prisms of the prism array or of the mirrors of the mirror array.

What is claimed is:

1. Optical assembly for symmetrizing the radiation of a plurality of laser diodes arranged adjacent to each other in the y-direction in fixed coordination, which radiate in the z-direction and whose radiation in the x-z and y-z planes is asymmetrical, a cylindrical lens system being mounted behind the laser diodes, wherein the cylindrical lens system is arranged tilted about the optical axis (z-axis) which is perpendicular to the x-y plane and collimates the output beams of the individual laser diodes in the x-direction and shifts them relative to each other and separates them in the process, in that behind the cylindrical lens system is mounted a first deflection element which deflects the beams of the individual laser diodes in the y-direction with different angles of deflection such that at a predetermined distance the centroids of the individual beams coincide, and in that a distance behind the first deflection element is arranged a second deflection element which recompensates the different angles of deflection of the beams relative to the optical axis (z-axis).

2. Assembly according to claim 1, wherein adjacent the second deflection element is arranged a focusing lens system which focuses the beams to a radiation spot of small dimensions.

3. Assembly according to claim 2, wherein the focusing lens system is formed from two lenses between which is arranged the second deflection element.

4. Assembly according to claim 2, wherein the focusing lens system is formed from achromatic lenses.

5. Assembly according to claim 1, wherein the cylindrical lens system is at least one of a graded-index microcylindrical lens (GRIN), an aspherical microcylindrical lens, a Fresnel lens, a plano-convex and biconvex lens or a combination thereof.

6. Assembly according to claim 5, wherein the graded-index microcylindrical lens has a refractive index profile which is one-dimensional in the first direction.

7. Assembly according to claim 5, wherein the graded-index microcylindrical lens has a two-dimensional refractive index profile.

8. Assembly according to claim 1, wherein the first deflection element is an achromatic lens or as a biconvex or plano-convex lens with spherical or aspherical surfaces or as a biconvex or plano-convex cylindrical lens.

9. Assembly according to claim 1, wherein the second deflection element is an array of deflection grids.

10. Assembly according to claim 9, wherein the deflection regions are arranged adjacent to each other in the x-direction with different angles of deflection of the deflection grid array.

11. Assembly according to claim 10, wherein the width of the deflection regions in the x-direction corresponds to the distance between the centroids of the beams in the x-direction on the plane of the second deflection element.

12. Assembly according to claim 11, wherein an array of cylindrical lenses working in the x-z plane whose width in the x or y-direction corresponds to the width of the deflection regions in the x or y-direction is mounted in front of or behind the second deflection element in such a way that each region of the second deflection element is assigned a cylindrical lens to improve the imaging properties of the assembly.

13. Assembly according to claim 1, wherein the second deflection element is a prism array.

14. Assembly according to claim 13, wherein the prisms are arranged adjacent to each other in the x-direction with different angles of deflection of the prism array.

15. Assembly according to claim 14, wherein the width of each prism of the prism array in the x-direction corresponds to the distance between the centroids of the beams in the x-direction on the plane of the second deflection element.

16. Assembly according to claim 15, wherein an array of cylindrical lenses working in the x-z plane whose width in the x- or y-direction corresponds to the width of the prisms of the prism array in the x or y-direction is mounted in front of or behind the second deflection element in such a way that each prism of the second deflection element is assigned a cylindrical lens to improve the imaging properties of the assembly.

17. Assembly according to claim 1, wherein the second deflection element is a mirror array.

18. Assembly according to claim 17, wherein the mirrors are arranged adjacent to each other in the x-direction with different angles of deflection of the mirror array.

19. Assembly according to claim 18, wherein the width of each mirror of the mirror array in the x-direction corresponds to the distance between the centroids of the beams in the x-direction on the plane of the second deflection element.

20. Assembly according to claim 19, wherein an array of cylindrical lenses working in the x-z plane whose width in the x- or y-direction corresponds to the width of the mirrors of the mirror array in the x or y-direction is mounted in front of or behind the second deflection element in such a way that each mirror of the second deflection element is assigned a cylindrical lens to improve the imaging properties of the assembly.

* * * * *